(12) United States Patent
Ker et al.

(10) Patent No.: US 7,868,659 B2
(45) Date of Patent: Jan. 11, 2011

(54) I/O BUFFER WITH TWICE THE SUPPLY VOLTAGE TOLERANCE USING NORMAL SUPPLY VOLTAGE DEVICES

(75) Inventors: Ming-Dou Ker, Kaohsiung (TW); Yan-Liang Lin, Kaohsiung (TW); Chua-Chin Wang, Kaohsiung (TW)

(73) Assignee: National Sun Yat-Sen University, Kaohsiung (TW)

( * ) Notice: Subject to any disclaimer, the term of this patent is extended or adjusted under 35 U.S.C. 154(b) by 0 days.

(21) Appl. No.: 12/575,787

(22) Filed: Oct. 8, 2009

(65) Prior Publication Data

US 2010/0253392 A1    Oct. 7, 2010

(30) Foreign Application Priority Data

Apr. 3, 2009    (TW) .............................. 98111285 A

(51) Int. Cl.
  *H03K 19/0175*    (2006.01)
(52) U.S. Cl. ........................... 326/81; 326/86; 327/108; 327/333
(58) Field of Classification Search ............. 326/80–81, 326/62–92; 327/108, 333
See application file for complete search history.

(56) References Cited

U.S. PATENT DOCUMENTS

| | | | | |
|---|---|---|---|---|
| 5,604,449 A | * | 2/1997 | Erhart et al. ................... | 326/81 |
| 5,684,415 A | * | 11/1997 | McManus ..................... | 326/81 |
| 5,712,586 A | * | 1/1998 | Kitao .......................... | 327/333 |
| 5,834,948 A | * | 11/1998 | Yoshizaki et al. ............. | 326/81 |
| 5,896,045 A | * | 4/1999 | Siegel et al. .................. | 326/81 |
| 6,040,729 A | * | 3/2000 | Sanchez et al. ............. | 327/309 |
| 6,057,710 A | * | 5/2000 | Singh .......................... | 326/81 |
| 6,064,227 A | * | 5/2000 | Saito ........................... | 326/68 |
| 6,064,230 A | * | 5/2000 | Singh .......................... | 326/83 |
| 6,130,557 A | * | 10/2000 | Drapkin et al. ............... | 326/81 |
| 6,229,365 B1 | * | 5/2001 | Iketani et al. ............... | 327/170 |
| 6,268,744 B1 | * | 7/2001 | Drapkin et al. ............... | 326/81 |
| 6,388,470 B1 | * | 5/2002 | Mattos et al. ................. | 326/81 |
| 6,392,440 B2 | * | 5/2002 | Nebel ........................... | 326/81 |
| 6,429,716 B1 | * | 8/2002 | Drapkin et al. ............. | 327/333 |
| 6,509,759 B1 | * | 1/2003 | Hynes .......................... | 326/81 |
| 6,577,163 B1 | * | 6/2003 | Waldrip et al. ............... | 326/81 |
| 6,768,368 B2 | * | 7/2004 | Kaneko et al. ............. | 327/333 |
| 6,833,746 B2 | * | 12/2004 | Drapkin et al. ............. | 327/333 |
| 6,859,074 B2 | * | 2/2005 | Ajit ............................ | 327/108 |
| 6,870,407 B2 | * | 3/2005 | Lundberg ................... | 327/112 |

(Continued)

*Primary Examiner*—James H. Cho
*Assistant Examiner*—Matthew C Tabler
(74) *Attorney, Agent, or Firm*—Muncy, Geissler, Olds & Lowe, PLLC

(57) ABSTRACT

The invention relates to an I/O buffer with twice the supply voltage tolerance using normal supply voltage devices. The I/O buffer of the invention includes a driver, a first level converter, a gate-controlled circuit and a dynamic source output stage. Signals of the I/O buffer are classified into a first voltage range and a second voltage range. The first voltage range is zero to the normal supply voltage, and the second voltage range is the normal supply voltage to twice the supply voltage. Therefore, the voltage between any two terminals of any of the transistors in the I/O buffer does not exceed the normal supply voltage so that the I/O buffer of the invention can transmit and receive signals with a voltage swing twice as high as the normal power supply voltage using normal supply voltage devices and without gate-oxide reliability problems.

9 Claims, 9 Drawing Sheets

U.S. PATENT DOCUMENTS

| | | | |
|---|---|---|---|
| 6,975,134 B2* | 12/2005 | Kuang et al. | 326/27 |
| 7,088,167 B2* | 8/2006 | Itoh | 327/333 |
| 7,135,914 B2* | 11/2006 | Chih et al. | 327/543 |
| 7,215,146 B2* | 5/2007 | Khan | 326/83 |
| 7,224,195 B2* | 5/2007 | Pilling et al. | 327/112 |
| 7,362,136 B2* | 4/2008 | Chen | 326/81 |
| 7,560,970 B2* | 7/2009 | Cook et al. | 327/333 |
| 7,570,088 B1* | 8/2009 | Ku et al. | 327/112 |
| 7,573,314 B2* | 8/2009 | Nagayama | 327/333 |
| 7,586,343 B2* | 9/2009 | Pilling et al. | 327/112 |
| 7,777,522 B2* | 8/2010 | Yang et al. | 326/68 |
| 2002/0011873 A1* | 1/2002 | Riccio et al. | 326/80 |
| 2002/0024359 A1* | 2/2002 | Chan et al. | 326/81 |
| 2002/0093362 A1* | 7/2002 | Matsumoto | 326/80 |
| 2005/0040852 A1* | 2/2005 | Mentze et al. | 326/81 |
| 2005/0040854 A1* | 2/2005 | Mentze et al. | 326/81 |
| 2005/0156631 A1* | 7/2005 | Huang | 326/81 |
| 2005/0258864 A1* | 11/2005 | Chen et al. | 326/81 |
| 2006/0033529 A1* | 2/2006 | Chauhan et al. | 326/81 |
| 2006/0091907 A1* | 5/2006 | Khan | 326/81 |
| 2007/0052445 A1* | 3/2007 | Wu et al. | 326/81 |
| 2008/0231322 A1* | 9/2008 | Mohammad et al. | 326/80 |

* cited by examiner

| Operation Mode | I/O PAD | TP | TN | Node A | Node B |
|---|---|---|---|---|---|
| transmission | Low (0V) | VDD | VDD | VDD | 0V |
| transmission | High (2xVDD) | VDD | VDD | 2xVDD | VDD |
| receiving | Low (0V) | VDD | 0V | VDD | VDD |
| receiving | High (2xVDD) | 2xVDD | VDD | VDD | VDD |

FIG.4

I/O BUFFER WITH TWICE THE SUPPLY VOLTAGE TOLERANCE USING NORMAL SUPPLY VOLTAGE DEVICES

FIELD OF THE INVENTION

The present invention relates to an I/O buffer, and more particularly to an I/O buffer with twice the supply voltage tolerance using normal supply voltage devices.

BACKGROUND OF THE INVENTION

Due to rapid pace of CMOS technological developments, the size of transistors has reduced leading to lower costs and increased performance. The gate oxide thickness has become thinner, reducing the operating voltages for lower power consumption. Simultaneously, the maximum voltages of the terminals (source, drain and gate) of the transistor need to be designed correspondingly lower to ensure the lifetime of the devices. However, concerning the compatibility of CMOS integrated circuit interface protocols in a micro-electronic system, the chips manufactured with advanced CMOS processes have a signal interface voltage level that is higher than their standard voltage. Such high voltages at the thin gate oxide may damage the gate oxide. Therefore, the input/output circuit (I/O) must be carefully designed to resolve this problem. A prior art hybrid voltage I/O buffer having a thin oxide device can transmit output signals between 0V to VDD and receive input signals between 0V to 2×VDD; or can transmit output signals between 0V to 2×VDD but have no receiving capabilities.

Please refer to FIG. 1. FIG. 1 is a block drawing of a prior art hybrid voltage output buffer. A prior art hybrid voltage output buffer 10 has a three-mode control circuit 11, a level converter 12, a first buffer 13, a second buffer 14 and an output stage circuit 15. The output stage circuit 15 has two stacked PMOS transistors (P1 and P2) and NMOS transistors (N1 and N2). The transistors P1 and P2 are 2.5V devices, while transistor N1 is a 1V device, and transistor N2 is a 2.5V NMOS transistor with a threshold voltage of −0.1 V. Because the gate voltage of the transistors P2 and N2 are biased by 1V (VDD), the gate-source voltage and gate-drain voltage of the transistors P2 and N2 are not higher than 2.5V. To prevent the gate oxide of transistor P1 from overstress and to completely turn off transistor P1, voltage range at point PU should be between 1V to 3.3V. The NMOS transistor N2 can increase the driving capabilities of the output buffer, but it also causes serious subthreshold leakage currents. If the voltage at the output node (OUT) is 3.3V, due to the serious subthreshold leakage current at the transistor N2, the voltage at node Y may exceed 1V. Therefore, a transistor P3 is used to keep the maximum voltage at node Y to 1V. Moreover, the prior art hybrid voltage output buffer can only transmit output signals between 0V to 2×VDD but has no receiving function.

Please refer to FIG. 2. FIG. 2 is a circuit diagram of a prior art level converter of a hybrid voltage output buffer. The prior art level converter 12 is used for converting 0/1V voltage amplitudes to 1/3.3V voltage amplitudes. When the IN signal input node is 1V and the INB signal input node is 0V, the voltage at node B1 is pulled down to 0V, and the transistor P5A is on. After the transistor P5A is on, the voltage of the OUTB output node is 1V, and the transistors P4B, P1B are on. Therefore, the voltages of the OUT output node and the B2 node are 3.3V. Because PMOS transistors pull down the voltages of the node OUT and OUTB too slowly, two coupled NMOS transistors N3A and N3B are used for increasing pull-down speed. In addition, in the prior art level converter 12, the voltage levels of the nodes C1 and C2 are uncertain.

Therefore, it is desirable to provide an I/O buffer with twice the supply voltage tolerance using normal supply voltage devices to mitigate and/or obviate the aforementioned problems.

SUMMARY

The present invention provides an I/O buffer with twice the supply voltage tolerance using normal supply voltage devices. The I/O buffer of the invention includes a driver, a first level converter, a gate-controlled circuit and a dynamic source output stage. The driver is used for receiving a mode control signal and a data output signal and generating a first driving signal and a second driving signal. The first level converter is used for receiving the first driving signal to convert a first voltage range of the first driving signal into a second voltage range and output a level translating signal. The gate-controlled circuit is used for receiving the mode control signal and an I/O terminal signal and generating a first gate-controlled signal and a second gate-controlled signal. The dynamic source output stage circuit has a first output circuit, a second output circuit and an I/O terminal, the first output circuit and the second output circuit having a plurality of transistors. The first output circuit is in the second voltage range and controlled by the level translating signal and the first gate-controlled signal. The second output circuit is in the first voltage range and controlled by the second gate-controlled signal and the second driving signal, such that the voltage across any two terminals of the transistors is not higher than the normal supply voltage and the I/O terminal is used for transmitting or receiving double the supply voltage.

Signals of the I/O buffer are classified into a first voltage range and a second voltage range. The first voltage range is zero to the normal supply voltage, and the second voltage range is the normal supply voltage to twice the supply voltage. Therefore, the voltage between any two terminals of any of the transistors in the I/O buffer does not exceed the normal supply voltage so that the I/O buffer of the invention can transmit and receive signals with a voltage swing twice as high as the normal power supply voltage using normal supply voltage devices and without gate-oxide reliability problems.

Other objects, advantages, and novel features of the invention will become more apparent from the following detailed description when taken in conjunction with the accompanying drawings.

DESCRIPTION OF THE DRAWINGS

FIG. 4 is a table showing voltage levels of a first gate-controlled signal TP, a second gate-controlled signal TN, a first connecting point A and a second connecting point B at an I/O terminal I/O PAD while the I/O terminal I/O PAD is at a high level or a low level in transmission or receiving modes.

DETAILED DESCRIPTION OF THE INVENTION

Figure 3:
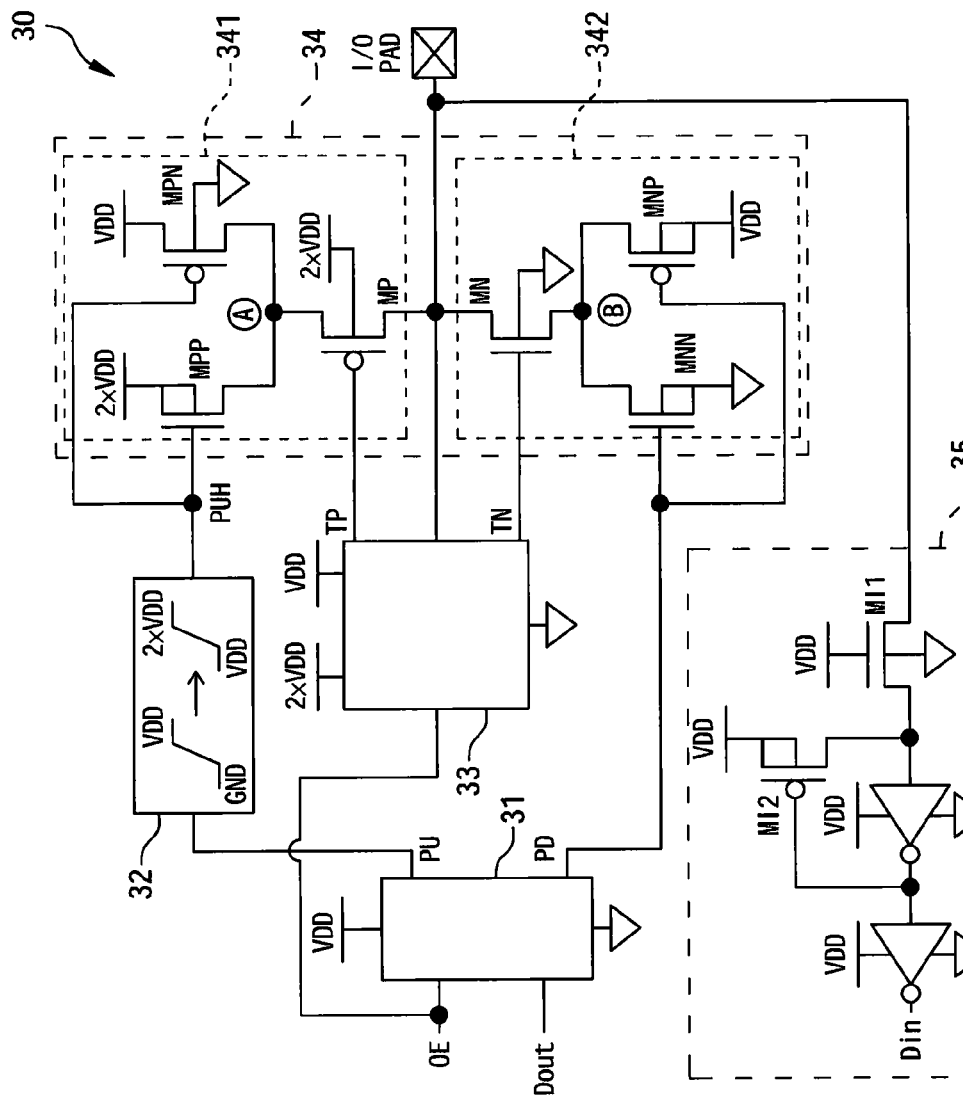
FIG. 3 is a circuit diagram of an I/O buffer utilizing a normal supply voltage element to provide doubled supply voltage tolerance circuit according to the present invention.

Please refer to FIG. 3. FIG. 3 is a circuit diagram of an I/O buffer utilizing a normal supply voltage element to provide a doubling supply voltage tolerance circuit according to the present invention. An I/O buffer 30 comprises a driver 31, a first level converter 32, a gate-controlled circuit 33 and a dynamic source output stage circuit 34. The driver 31 receives a mode control signal OE and a data output signal Dout and generates a first driving signal PU and a second driving signal PD.

The first level converter 32 is used for receiving the first driving signal PU to convert a first voltage range of the first driving signal PU to a second voltage range and output a level converter signal PUH. In this embodiment, the first voltage range is from 0 to a normal supply voltage VDD, and a second voltage range is the normal supply voltage VDD to twice the normal supply voltage VDD, i.e., 2VDD. Therefore, a voltage level range of the first driving signal PU is from 0 to the normal supply voltage VDD, and a the voltage level range of the level converter signal PUH is from the normal supply voltage VDD to twice the supply voltage 2VDD.

The gate-controlled circuit 33 is used for receiving the mode control signal OE and an I/O terminal signal and generating a first gate-controlled signal TP and a second gate-controlled signal TN. The dynamic source output stage circuit 34 has a first output circuit 341, a second output circuit 342 and an I/O terminal I/O PAD. The first output circuit 341 and the second output circuit 342 have a plurality of transistors, wherein the first output circuit 341 is in the second voltage range and controlled by the level converter signal PUH and the first gate-controlled signal TP. The second output circuit 342 is in the first voltage range and controlled by the second gate-controlled signal TN and the second driving signal PD. Therefore, the voltage across any two terminals of the transistors is not higher than the normal supply voltage, and the I/O terminal I/O PAD is used for transmitting or receiving the doubled supply voltage 2VDD.

In this embodiment, the first output circuit 341 of the dynamic source output stage circuit 34 comprises a first transistor MPP, a second transistor MPN and a third transistor MP, and the second output circuit 342 comprises a fourth transistor MN, a fifth transistor MNN and a sixth transistor MNP. Gates of the first transistor MPP and the second transistor MPN are controlled by the level converter signal PUH, and the first transistor MPP and the second transistor MPN are connected to a first connecting point A. The third transistor MP is electrically disposed between the first connecting point A and the I/O terminal I/O PAD, and its gate is controlled by the first gate-controlled signal TP. Gates of the fifth transistor MNN and the sixth transistor MNP are controlled by the second driving signal PD, and the fifth transistor MNN and the sixth transistor MNP are connected to a second connecting point B. The fourth transistor MN is electrically disposed between the second connecting point B and the I/O terminal I/O PAD, and its gate is controlled by the second gate-controlled signal TN.

The I/O buffer 30 further comprises an input circuit 35, which has a plurality of transistors MI1, MI2 and a plurality of inverters for connecting to the I/O terminal and outputting a data input signal Din.

When the I/O buffer 30 is in a transmission mode, the voltage level of the mode control signal OE is the supply voltage VDD, and the gate-controlled circuit 33 make the first gate-controlled signal TP and the second gate-controlled signal TN be the supply voltage VDD. Now, if a high voltage signal (Dout=VDD) is transmitted to cause the voltage level of the first driving signal PU to go to zero, after passing through the first level converter 32, the voltage level of the level converter signal PUH is the supply voltage VDD; so the first transistor MPP is on, the second transistor MPN is off, the first connecting point A has the doubled supply voltage 2VDD, and the third transistor MP is on. Furthermore, the voltage level of the second driving signal PD is zero, the fifth transistor MNN is off, the sixth transistor MNP is on, and so the voltage level of the second connecting point B is the supply voltage VDD. Since the second gate-controlled signal TN is the supply voltage VDD, and the fourth transistor MN is off, the I/O terminal I/O PAD is twice the supply voltage 2VDD. When the voltage level of the second connecting point B is the supply voltage VDD, the voltage across any two ends of the fourth transistor MN is the normal supply voltage. Therefore, the supply voltage at any two ends of all transistors of the dynamic source output stage circuit 34 is not higher than the supply voltage, and the normal supply voltage element provides twice the supply voltage tolerant transmission without gate-oxide reliability problems.

When the I/O buffer 30 is in the transmission mode and transmits zero voltage (Dout=0), the voltage level of the mode control signal OE is the supply voltage VDD and the voltage levels of the first driving signal PU and the second driving signal PD are the supply voltage VDD; after passing through the first level converter 32, the voltage level of the level converter signal PUH is twice the supply voltage 2VDD, the first transistor MPP is off, the second transistor MPN is on, and the voltage level of the first connecting point A is the supply voltage VDD. When the voltage level of the mode control signal OE is the supply voltage VDD, after passing through the gate-controlled circuit 33, the first gate-controlled signal TP and the second gate-controlled signal TN are the supply voltage VDD, and so the third transistor MP is off.

When the voltage level of the second driving signal PD is the supply voltage VDD, the fifth transistor MNN is on, the sixth transistor MNP is off, and so the voltage level of the second connecting point B is zero. In addition, since the second gate-controlled signal TN is the supply voltage VDD, the fourth transistor MN is on, and the I/O terminal I/O PAD has zero voltage. Since the voltage level of the first connecting point A is the supply voltage VDD, the voltage between any two terminals of any of the third transistors MP is the normal supply voltage.

When the I/O buffer 30 is in the receiving mode, the I/O terminal I/O PAD receives signals and outputs a data input signal Din; the voltage level of the mode control signal OE is zero, and the voltage level of the first driving signal PU is the supply voltage VDD; after passing through the first level converter 32, the voltage level of the level converter signal PUH is twice the supply voltage 2VDD, the first transistor MPP is off and the second transistor MPN is on, and the voltage level of the first connecting point A is the supply voltage VDD. Moreover, the voltage level of the second driving signal PD is zero, so the fifth transistor MNN is off and the sixth transistor MNP is on, and the voltage level of the second connecting point B is the supply voltage VDD.

When the I/O terminal I/O PAD receives twice the supply voltage 2VDD, after passing through the gate-controlled circuit 33, the first gate-controlled signal TP is twice the supply voltage 2VDD, the second gate-controlled signal TN is the supply voltage VDD, and so the third transistor MP and the fourth transistor MN are off.

When the I/O terminal I/O PAD receives zero voltage, after passing through the gate-controlled circuit 33, the first gate-controlled signal TP is the supply voltage VDD, the second gate-controlled signal TN is at zero volts, and so the third transistor MP and the fourth transistor MN are off.

Therefore, when the I/O buffer 30 is in the receiving mode, the I/O terminal I/O PAD receives either twice the supply voltage 2VDD or zero volts, the voltage between any two terminals of any transistor in the dynamic source output stage circuit 34 is not higher than the normal supply voltage, and thus the normal supply voltage element provides twice the supply voltage tolerant reception without gate-oxide reliability problems.

Please refer to FIG. 4. FIG. 4 is a table showing the voltage levels of the first gate-controlled signal TP, the second gate-controlled signal TN, the first connecting point A and the second connecting point B at the I/O PAD while the I/O PAD is at a high level or a low level in the transmission or receiving modes. As shown in FIG. 4, whether the I/O terminal I/O PAD transmits or receives twice the supply voltage 2VDD or zero voltage, the voltage between any two terminals of any transistor in the dynamic source output stage circuit 34 is not higher than the normal supply voltage, and the normal supply voltage element performs twice the supply voltage tolerance reception without gate-oxide reliability problems.

To prevent current leakage from the parasitic PN junction diode in the P channel transistor, bases of the first transistor MPP and the third transistor MP are connected to the doubled supply voltage 2VDD, and bases of the sixth transistor MNP and transistor MI1 are connected to the supply voltage VDD. In general, in standard CMOS processes, the breakdown voltage from the source to the base is at least twice the operating voltage. Therefore, the above mentioned I/O buffer does not have breakdown voltage problems from the source to the base.

Figure 5:
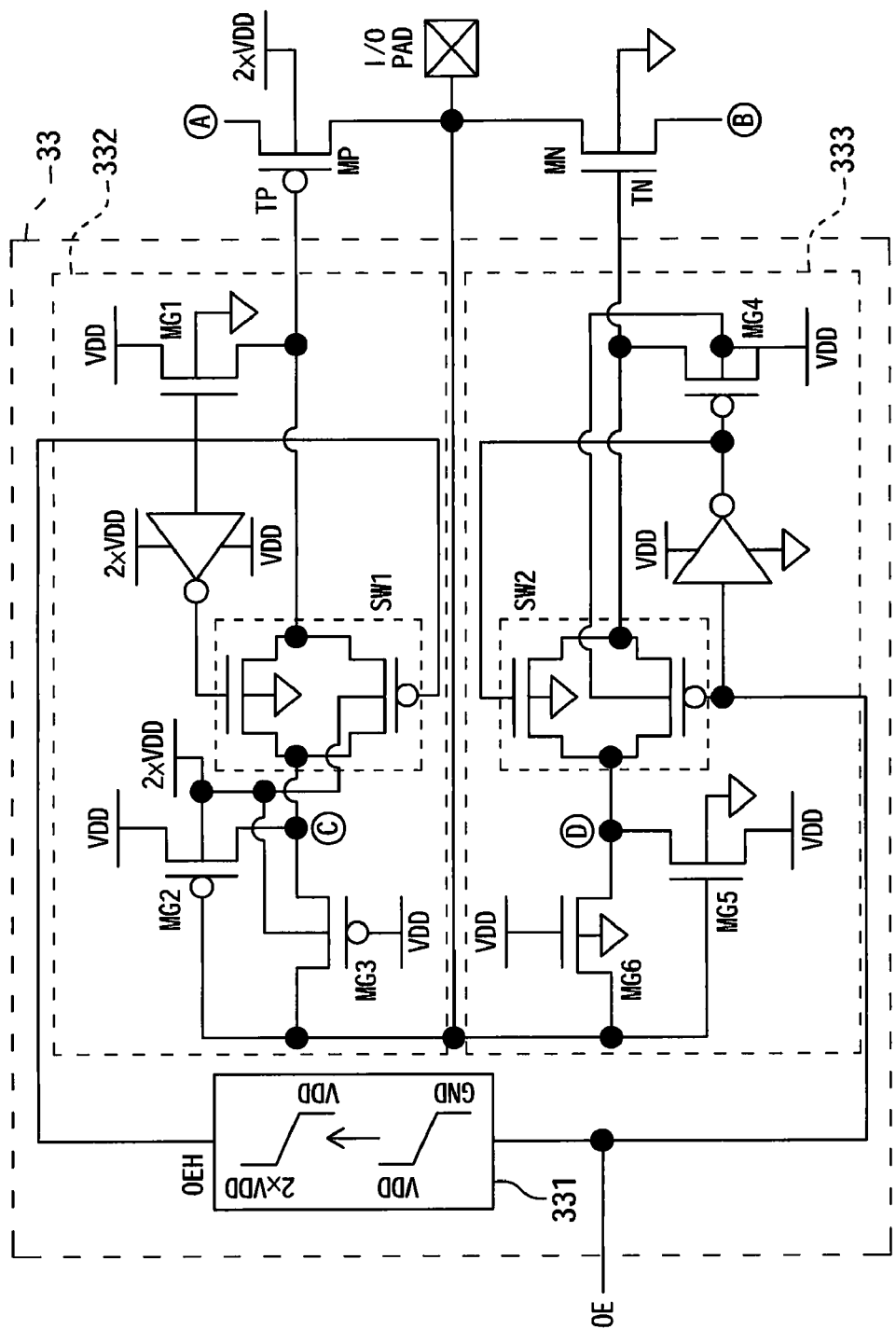
FIG. 5 is a circuit diagram of a gate-controlled circuit according to the present invention.

Please refer to FIG. 5. FIG. 5 is a circuit schematic drawing of a gate-controlled circuit according to the present invention. The gate-controlled circuit 33 comprises a second level converter 331, a first partial circuit 332 and a second partial circuit 333. The second level converter 331 is used for receiving the mode control signal to convert a first voltage range of the mode control signal OE to a second voltage range and output a mode control signal OEH with a high voltage level to the first partial circuit 332. In this embodiment, the first voltage range is from 0 to the supply voltage VDD, and the second voltage range is from the supply voltage VDD to twice supply voltage 2VDD. Therefore, signals of the first partial circuit 332 are in the second voltage range and output a first gate-controlled signal TP. The second partial circuit 333 receives the mode control signal OE signal which is in the first voltage range, and outputs a second gate-controlled signal TN.

When the I/O buffer 30 is in the transmission mode, the voltage level of the mode control signal OE is the supply voltage VDD, and the voltage level of the mode control signal OEH having a high voltage level is twice the supply voltage 2VDD. Therefore, a first switch SW1 in the first partial circuit 332 is off, a transistor MG1 is on, and the voltage level of the first gate-controlled signal TP is the supply voltage VDD. When the voltage level of the mode control signal OE is the supply voltage VDD, a second switch SW2 of the second partial circuit 333 is off, a transistor MG4 is on, and the voltage level of the second gate-controlled signal TN is the supply voltage VDD.

When the I/O buffer 30 is in the receiving mode, the voltage level of the mode control signal OE is zero, so the voltage level of the mode control signal OEH having a high voltage level is the supply voltage VDD. Therefore, the first switch SW1 in the first partial circuit 332 is on, the transistor MG1 is off, the second switch SW2 in the second partial circuit 333 is on, and the transistor MG4 is off.

When the I/O terminal I/O PAD receives high voltage signals (i.e., twice the supply voltage 2VDD), a transistor MG3 is on, a transistor MG2 is off, and the voltage level of the third connecting point C is twice the supply voltage 2VDD. After the first switch SW1 is on, the voltage level of the first gate-controlled signal TP is twice the supply voltage 2VDD. Furthermore, in the second partial circuit 333, a transistor MG5 is on, and the voltage level of the fourth connecting point D is the supply voltage VDD. Since the second switch SW2 is on, the voltage level of the second gate-controlled signal TN is the supply voltage VDD.

When the I/O terminal I/O PAD receives a low voltage signal (i.e., zero volts), the transistor MG2 is on, the transistor MG3 is off, and the voltage level of the third connecting point C is the supply voltage VDD. Since the first switch SW1 is on, the voltage level of the first gate-controlled signal TP is the supply voltage VDD. Moreover, in the second partial circuit 333, a transistor MG6 is on, the voltage level of the fourth connecting point D is zero. Since the second switch SW2 is on, the voltage level of the second gate-controlled signal TN is zero.

The gate-controlled circuit 33 comprises a first partial circuit 332 and a second partial circuit 333, which are complementary in structure. The first partial circuit 332 only operates in the second voltage range, and the second partial circuit 333 only operates in the first voltage range; therefore, the gate-controlled circuit 33 does not have reliability problems. The signal voltage level of the P channel transistor in the first partial circuit 332 is twice the supply voltage 2VDD, so its base is connected to twice the supply voltage 2VDD; the signal voltage level of the P channel transistor in the second partial circuit 333 is the supply voltage VDD, so its base is connected to the supply voltage VDD.

Figure 1:
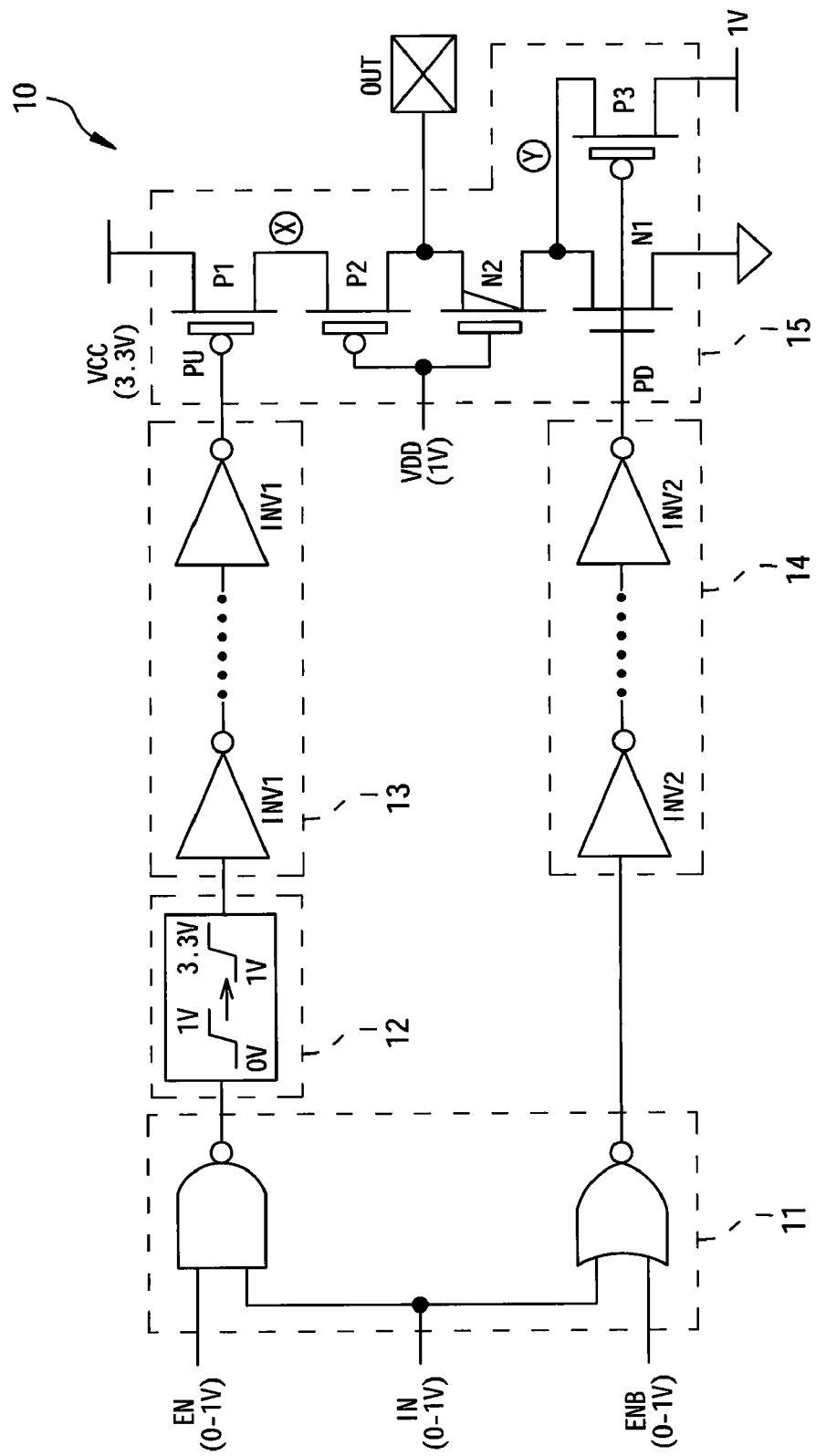
FIG. 1 is a block drawing of a prior art hybrid voltage output buffer.
Figure 2:
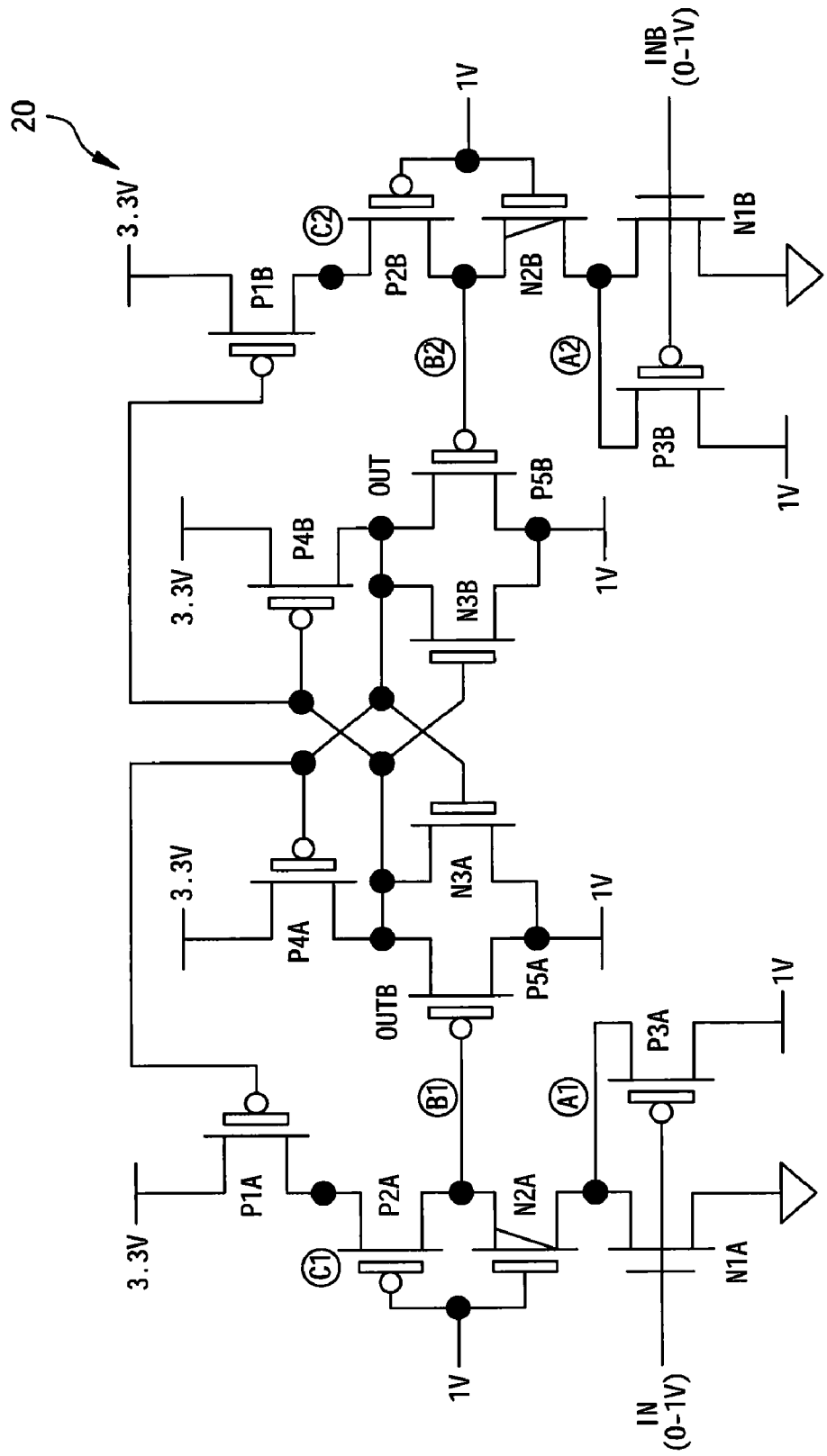
FIG. 2 is a circuit diagram of a prior art level converter of a hybrid voltage output buffer.
Figure 6:
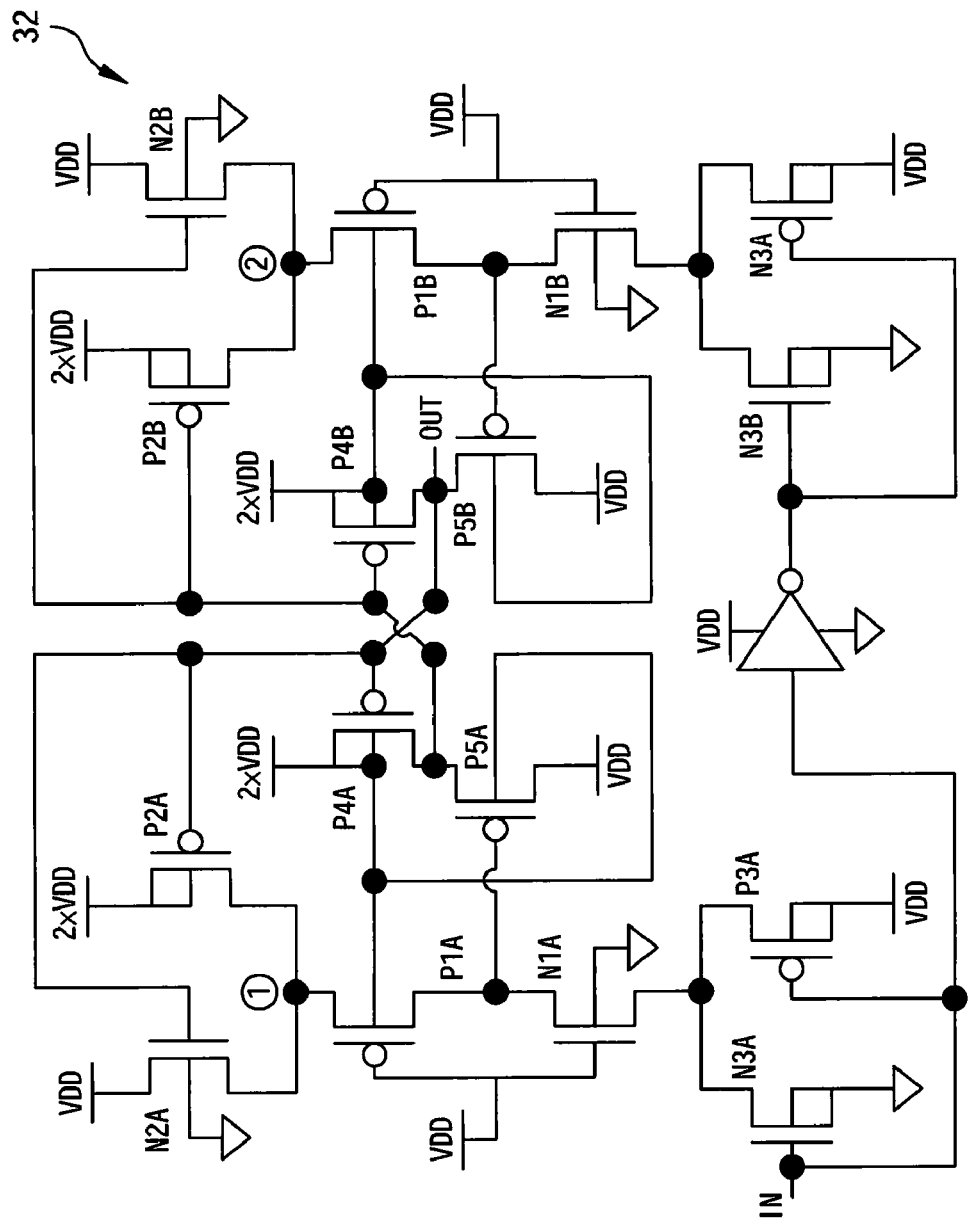
FIG. 6 is a circuit diagram of a first level converter according to the present invention.

Please refer to FIG. 6. FIG. 6 is a circuit diagram of a first level converter according to the present invention. Compared to the prior art level converter shown in FIG. 2, the first level converter 32 has two transistors N2A and N2B so the voltage level of the first node 1 and the second node 2 is clear. In other words, when the transistors P2A and P2B are off, the voltage levels of the first node 1 and the second node 2 are maintained at the supply voltage VDD. The IN port shown in FIG. 6 is connected to the first driving signal PU shown in FIG. 3. In the embodiment, the I/O buffer utilizes two level converters; the first level converter 32 converts the first driving signal PU to the level converter signal PUH, and the second level converter 331 converts the mode control signal OE to the mode control signal OEH with a high voltage level. The circuit structure of the second level converter 331 is identical to the circuit structure of the first level converter 32, and so requires no further description.

Figure 7:
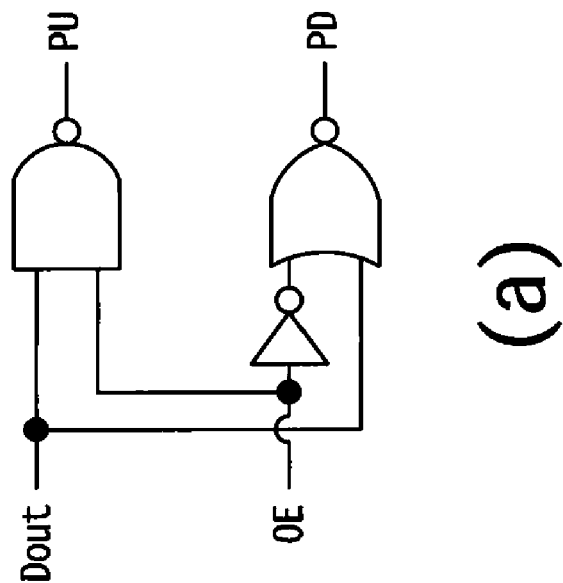
FIG. 7 shows two circuit diagrams according to the present invention.
Figure 7:
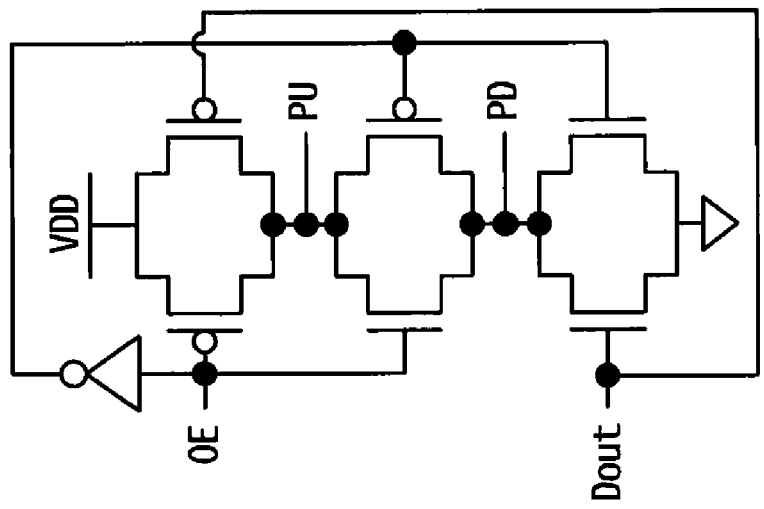

Please refer to FIG. 7. FIG. 7 shows two circuit schematic drawings according to the present invention. The driver is used for controlling the operational mode of the I/O buffer; when the voltage level of the mode control signal OE is the supply voltage VDD, the I/O buffer 30 is in the transmission mode, and the voltage level of the first driving signal PU and the second driving signal PD is determined by the data output signal Dout. When the voltage level of the data output signal Dout is the supply voltage VDD, the voltage levels of the first driving signal PU and the second driving signal PD are zero. When the voltage level of the data output signal Dout is zero volts, then the voltage levels of the first driving signal PU and the second driving signal PD are the supply voltage VDD.

When the voltage level of the mode control signal OE is zero, the I/O buffer 30 is in the receiving mode; the voltage level of the first driving signal PU is the supply voltage VDD and the voltage level of the second driving signal PD is zero volts; and the dynamic source output stage circuit 34 is off.

Figure 8:
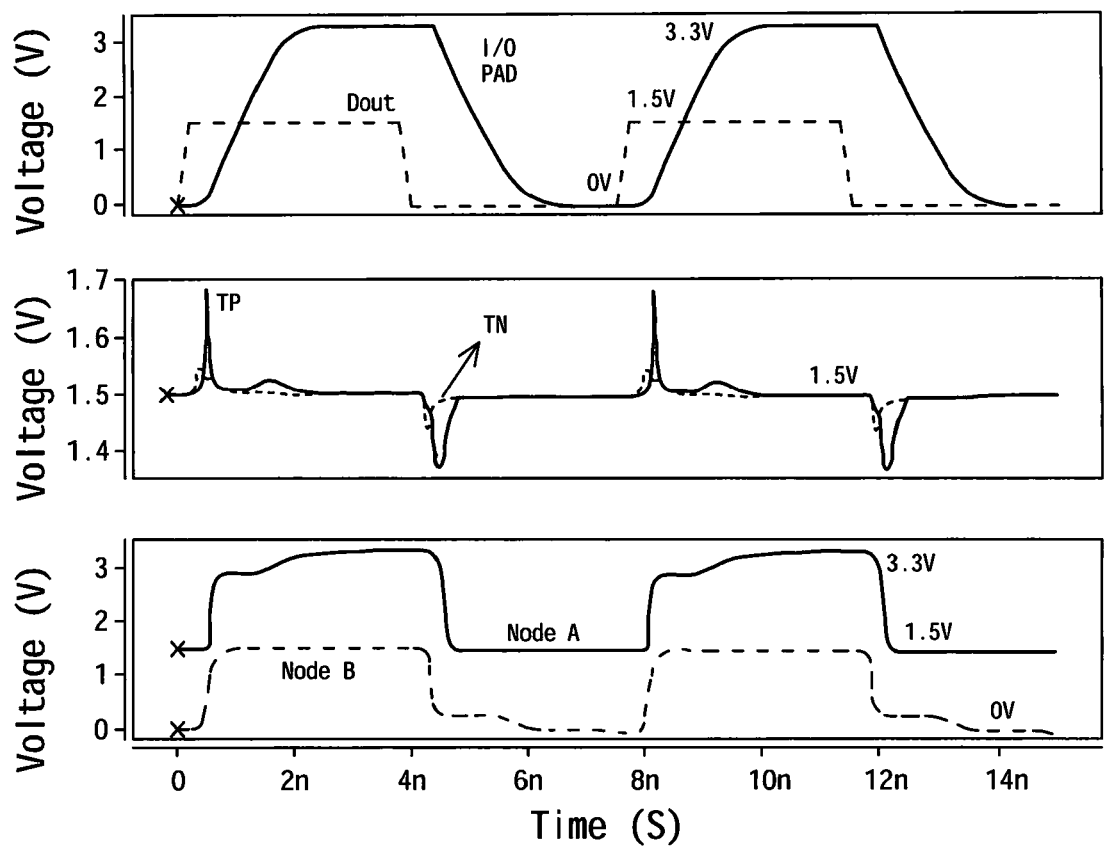
FIG. 8 is a simulated wave form drawing of an I/O buffer in a transmission mode according to the present invention.

In a 0.18 μm CMOS process, HSPICE is utilized to simulate the above-mentioned I/O buffer, and an output load is 10 pF. Please refer to FIG. 8. FIG. 8 is a simulated wave form drawing of the I/O buffer in a transmission mode according to the present invention. When the I/O buffer 30 is in the transmission mode, the voltage levels of the first gate-controlled signal TP and the second gate-controlled signal TN are 1.5V. As shown in FIG. 3, when the I/O terminal I/O PAD is at 3.3V, the first connecting point A is at 3.3V, and the second connecting point B is at 1.5V. When the I/O terminal I/O PAD is at 0V, the first connecting point A is at 1.5V, and the second connecting point B is at 0V.

Figure 9:
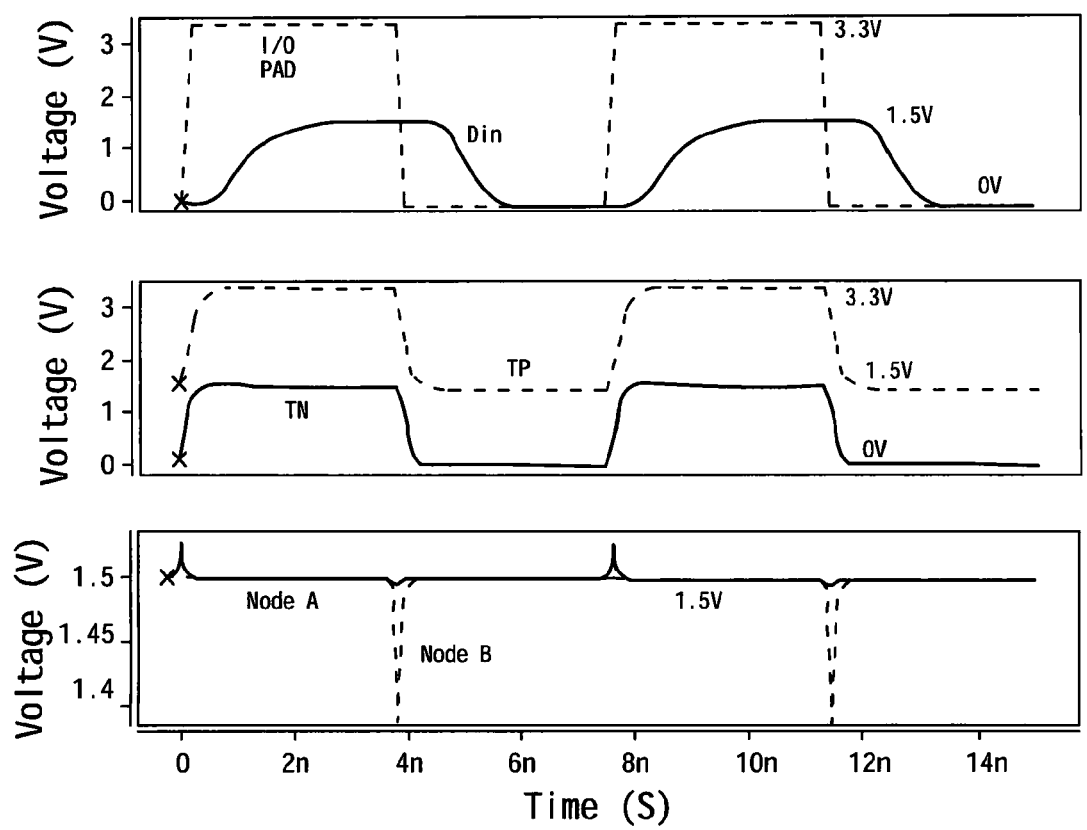
FIG. 9 is a simulating wave form schematic drawing of the I/O buffer in a receiving mode according to the present invention.

Please refer to FIG. 9. FIG. 9 is a simulated wave form drawing of the I/O buffer in a receiving mode according to the present invention. When the I/O buffer 30 is in the receiving mode, the first connecting point A is at 1.5V, and the second connecting point B is at 1.5V. As shown in FIG. 3, when the I/O terminal I/O PAD receives 3.3V, the first gate-controlled signal TP is at 3.3V, and the second gate-controlled signal TN is at 1.5V. When the I/O terminal I/O PAD receives 0V, the first gate-controlled signal TP is at 1.5V, and the second gate-controlled signal TN is at 0V. According to the simulation results, the I/O buffer of the present invention utilizes a normal supply voltage element to provide a twice the supply voltage tolerant circuit.

The signals of the I/O buffer are classified into a first voltage range and a second voltage range. The first voltage range is from zero to the normal supply voltage, and the second voltage range is from the normal supply voltage to twice the supply voltage. Therefore, the voltage between any two terminals of any of the transistors in the I/O buffer does not exceed the normal supply voltage so that the I/O buffer of the invention can transmit and receive signals with voltage swings twice as high as the normal power supply voltage using normal supply voltage devices without gate-oxide reliability problems.

Although the present invention has been explained in relation to its preferred embodiment, it is to be understood that many other possible modifications and variations can be made without departing from the spirit and scope of the invention as hereinafter claimed.

What is claimed is:

1. An I/O buffer with twice the supply voltage tolerance using normal supply voltage devices comprising:
    a driver, for receiving a mode control signal and a data output signal and generating a first driving signal and a second driving signal;
    a first level converter, for receiving the first driving signal to convert a first voltage range of the first driving signal into a second voltage range and output a level translating signal;
    a gate-controlled circuit, for receiving the mode control signal and an I/O terminal signal and generating a first gate-controlled signal and a second gate-controlled signal; and
    a dynamic source output stage circuit having a first output circuit, a second output circuit and an I/O terminal, the first output circuit and the second output circuit having a plurality of transistors; wherein the first output circuit is in the second voltage range and controlled by the level translating signal and the first gate-controlled signal; the second output circuit is in the first voltage range and controlled by the second gate-controlled signal and the second driving signal, such that the voltage across any two terminals of the transistors is not higher than the normal supply voltage and the I/O terminal is used for transmitting or receiving double the supply voltage.

2. The I/O buffer as claimed in claim 1 further comprising an input stage circuit, which has a plurality of transistor and a plurality of inverters for receiving the I/O terminal signal and outputting a data input signal.

3. The I/O buffer as claimed in claim 1, wherein the first output circuit of the dynamic source output stage circuit comprises a first transistor, a second transistor and a third transistor; the second output circuit comprises a fourth transistor, a fifth transistor and a sixth transistor; wherein gates of the first transistor and the second transistor are controlled by the level translating signal; the first transistor and the second transistor are connected to a first connecting point; the third transistor is electrically disposed between the first connecting point and the I/O terminal, and its gate is controlled by the first gate-controlled signal; gates of the fifth transistor and the sixth transistor are controlled by the second driving signal; the fifth transistor and the sixth transistor are connected to a second connecting point; and the fourth transistor is electrically disposed between the second connecting point and the I/O terminal, and its gate is controlled by the second gate-controlled signal.

4. The I/O buffer as claimed in claim 1, wherein the first voltage range is from 0 to the normal supply voltage, and the second voltage range is from the supply voltage to twice the supply voltage.

5. The I/O buffer as claimed in claim 1, wherein the gate-controlled circuit comprises a second level converter, a first partial circuit and a second partial circuit; wherein the second level converter is used for receiving the mode control signal to convert a first voltage range of the mode control signal into a second voltage range and output a mode control signal with a high voltage level to the first partial circuit; wherein the signal of the first partial circuit is within the second voltage range and outputs the first gate-controlled signal; and wherein the second partial circuit receives the mode control signal, and its signal is within the first voltage range and outputs the second gate-controlled signal.

6. The I/O buffer as claimed in claim 5, wherein the first voltage range of the mode control signal is from 0 to the normal supply voltage; and the second voltage range of the mode control signal with a high voltage level is from the normal supply voltage to twice the supply voltage.

7. The I/O buffer as claimed in claim 1, wherein when receiving, the gate-controlled circuit receives the mode control signal and the signal of the I/O terminal to generate the first gate-controlled signal and the second gate-controlled signal.

8. The I/O buffer as claimed in claim 1, wherein the first level converter has two transistors respectively connected to a first node and a second node of the first level converter, such that the voltage levels of the first connecting point and the second connecting point are the normal supply voltage.

9. The I/O buffer as claimed in claim 5, wherein the second level converter has two transistors respectively connected to a first node and a second node of the second level converter, such that the voltage levels of the first connecting point and the second connecting point are the normal supply voltage.

* * * * *